United States Patent
Protic et al.

(10) Patent No.: US 7,338,829 B2
(45) Date of Patent: Mar. 4, 2008

(54) SEMICONDUCTOR STRUCTURES HAVING THROUGH-HOLES SEALED WITH FEED THROUGH METALIZATION

(75) Inventors: Davor Protic, Jülich (DE); Thomas Krings, Linnich (DE)

(73) Assignee: Forschungszentrum Julich GmbH, Julich (DE)

( * ) Notice: Subject to any disclaimer, the term of this patent is extended or adjusted under 35 U.S.C. 154(b) by 0 days.

(21) Appl. No.: 10/494,412

(22) PCT Filed: Oct. 18, 2002

(86) PCT No.: PCT/DE02/03942

§ 371 (c)(1), (2), (4) Date: Apr. 27, 2004

(87) PCT Pub. No.: WO03/038472

PCT Pub. Date: May 8, 2003

(65) Prior Publication Data

US 2005/0001279 A1  Jan. 6, 2005

(30) Foreign Application Priority Data

Oct. 31, 2001 (DE) .............................. 101 53 241

(51) Int. Cl.
*H01L 21/00* (2006.01)
(52) U.S. Cl. .................. 438/48; 438/56; 438/542; 257/E31.087
(58) Field of Classification Search ............ 438/48–98, 438/514–542, 473, 476
See application file for complete search history.

(56) References Cited

U.S. PATENT DOCUMENTS

| | | |
|---|---|---|
| 3,225,198 A | 12/1965 | Mayer |
| 3,413,528 A | 11/1968 | Llacer |
| 3,413,529 A | 11/1968 | Goulding |
| 6,486,476 B1 * | 11/2002 | Ochiai et al. ......... 250/370.01 |
| 2004/0178461 A1 * | 9/2004 | Protic et al. ................ 257/428 |
| 2005/0001213 A1 * | 1/2005 | Tindall et al. ............... 257/52 |

OTHER PUBLICATIONS

"Thin Window Si(Li) Detectors for the ISEE-C Telescope"; J.T. Walton et al; IEEE transactions on Nuclear Science, vol. NS-25, No. 1, Feb. 1978; p. 391-394.
"Development of Lithiumodrifted Silicon Detectors . . . " Takashi Miyachi et al; Jpn.J.Appl.Phys.vol. 33(1994) pp. 4115-4120.
"Large Diameter Ithium Compensated Silicon Detectors for the NASA . . . "; G.L.Allbritton et al; IEEE transaction of Nuclear Science, vol. 43, No. 3 Jun. 1996; p. 1505-1509.
"X-Ray Detectors With Amorphous Silicon Passivation"; J.T. Walton et al; IEEE transaction on Nuclear Science, vol. NS-31, No. 1,Feb. 1984; p. 331-335.
"Rediation Detection and Measurement"; Chapter 13,Lithium-Drifted Silicon Detecctors; p. 458-459.G.F.Knoll.
"Long-Term Instability of Lithium-Drifted Silicon Detector" Takashi Miyachi et al; Jpn.J.Appl.Phys.vol. 34 (1995) p. 3065-3070.
"Stability of a Lithium-Drifted Silicon Detector";Takashi Miyachi et al; Jpn J.Appl.Phys.vol. 33 (1994) p. 4111-4114.

* cited by examiner

*Primary Examiner*—Savitri Mulpuri
(74) *Attorney, Agent, or Firm*—Andrew Wilford

(57) ABSTRACT

The invention relates to a method for producing a detector for determining the energy of photons and charged particles; to be precise, a so-called ΔE detector or transmission detector. The invention also relates to a detector that can be produced by using said method. The aim of the invention is to provide a method for producing a detector of the aforementioned type that is stable over a long period of time and in which dead zones are distinctly minimized. The invention also aims to provide a detector of this type. To these ends, the inventive method is used to produce a Si(Li) substrate having a $p^+$ layer and an n layer. These can be layers produced according to the prior art. According to the inventive method, the n layer is partially removed, for example, by chemical etching, honing or by lapping. Lapping, in particular, has proven to be effective. This reduces the zone that is ineffective in a detector of the aforementioned type. The detector is produced from the substrate treated in this manner. The dead zones in the detector are significantly minimized compared to those in a detector produced using prior art methods.

4 Claims, 1 Drawing Sheet

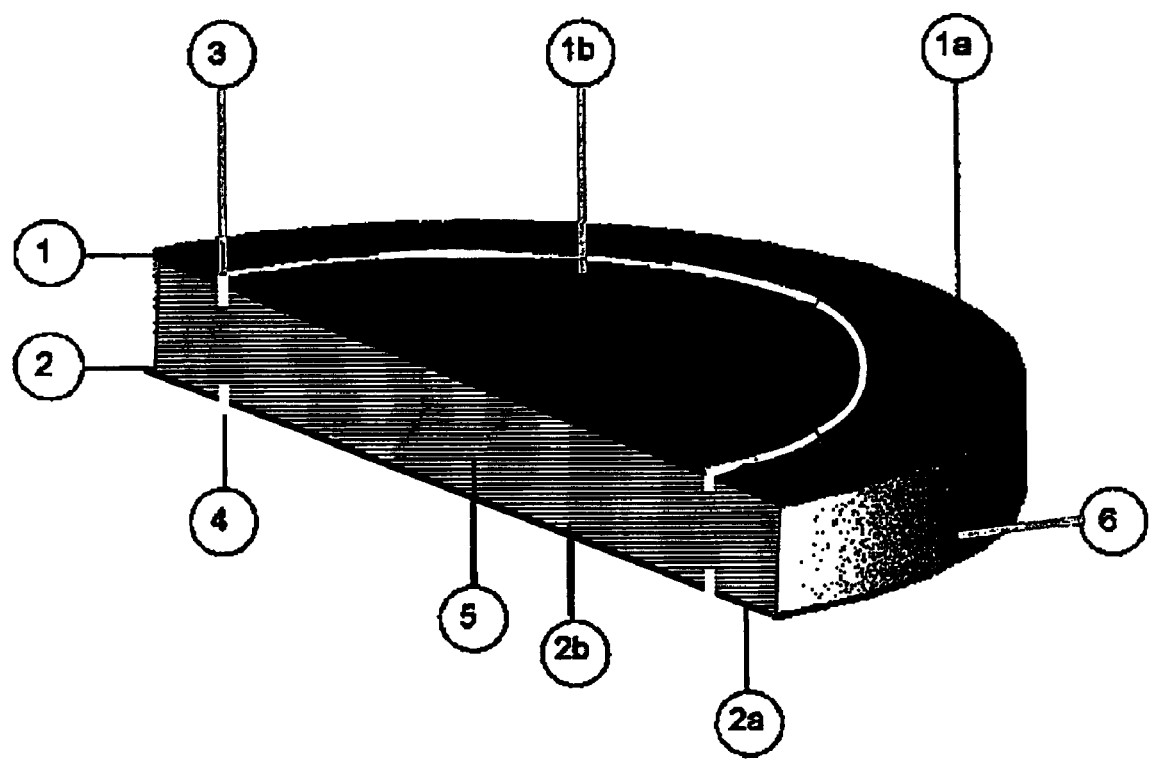

SEMICONDUCTOR STRUCTURES HAVING THROUGH-HOLES SEALED WITH FEED THROUGH METALIZATION

CROSS REFERENCE TO RELATED APPLICATIONS

This application is a national stage of PCT/DE02/03942 filed 18 Oct. 2002 and based upon German application 10153241.5 of 31 Oct. 2001 under the International Convention.

FIELD OF THE INVENTION

The invention relates to a method of making a detector for energy determination of photons and charged particles and particularly a so-called ΔE detector or transmission detector. The invention relates to a detector made in accordance with the method of the invention.

BACKGROUND OF THE INVENTION

Transmission or ΔE detectors of high purity silicon are commercially available and indeed up to a thickness of 1 mm. Occasionally, ΔE detectors up to 2 mm thick which are composed of high purity silicon can be obtained.

If ΔE detectors are to be made with greater thicknesses of 2 to 10 mm, pure silicon can no longer be used since that material is not available with the requisite degree of purity. Previously, lithium-compensated silicon [Si(Li)] has been used as the base material for this purpose. Such commercially available Si (Li) detectors have a small $p^+$ contact which has a thickness of less than 1 μm. It is in the form of a surface barrier layer which can be fabricated by vapor deposition of a metal layer and indeed has especially been produced by vapor deposition of gold or by $p^+$ contact made by boron implantation. In addition, these Si (Li) detectors have a 100 to 500 μm thick Li-diffused n contact. Within the 100 to 500 μm thick n contact layer a charged particle or photon will lose its energy without a reaction by the detector thereto. The region of the layer in which the detector does not react to the energy loss of the charged particle is termed the "dead zone" in the description which follows. The dead zone thus does not contribute to the determination of the energy of photons or charged particles.

In the publications IEEE Trans. Nucl. Sci. NS-25, No. 1(1978) 391; IEEE Trans. Nucl. Sci. NS-31, No. 1 (1984) 331; IEEE Trans. Nucl. Sci. NS-43, No. 3 (1996) 1505, method have been descried which seek to reduce the thickness of the Li diffused contact to 10 to 20 μm. There remains however a 10 to 20 μm thick layer and hence always a still relatively thick insensitive region or dead zone in the Si(Li) detector. Such a dead zone has an effect in practice as has already been remarked and is detrimental for a transmission detector.

Several authors have reported on ΔE detectors of Li compensated silicon in which the Li diffused n contact has been completely removed. Instead of the n contact, an ohmic contact is produced by vapor deposit of an aluminum layer as can be deduced from the publication Jpn. J. Appl. Phys. 33 (1994) 4115. These Si(Li) detectors, also of Li compensated silicon function well for a time after manufacture. However the same authors have reported on serious problems with the long-term stability of such detectors with ohmic contacts as can be deduced from the publication Jpn. J. Appl. Phys. 33 (1994) 4111 and Jpn. J. Appl. Phys. 34 (1995) 3065.

From the publication G. F. Knoll, "Radiation Detection and Measurement", Chapter 13, John Wiley & Sons, New York 2000, it has become known that the Si (Li) detectors retain their properties for some time and as a rule for several months after manufacture. Then, however, there begins to occur a redistribution of the lithium within the compensated volume. Several lithium ions, which are combined to acceptor ions meander to the crystal defects or other impurities. The compensated silicon transforms itself into the p type. To reduce the problems, the manufacturer seeks at room temperature to always apply a bias voltage to the detector when the same is not in operation. In this manner the compensation loss can be made up by "after drifting".

Such a treatment cannot be carried out with transmission detectors which are fabricated without Li diffusion contact since a p-layer develops again below the ohmic contact. As a consequence long-term stability problems arise.

Si(Li) detectors can be damaged by the radiation in the course of measurement. Such damaged Si(Li) detectors are regenerated by so-called "uredrifting" i.e. drift at temperatures between 50° C. and 100° C. as has been described by the publication M. Saskola and K. Nybo, Nucl. Instr. Meth. 44 (1966) 141. In this case because of redrifting the lattice defects (usually of the p-type) resulting from radiation are compensated by Li ions. With transmission detectors without Li diffused contacts, such a process is not possible since a p-layer forms beneath the ohmic contact. On this ground as well there are long-term stability problems.

OBJECTS OF THE INVENTION

The object of the invention is to provide a method for the fabrication of a detector of the type described at the outset which has long-term stability and in the dead zones are significantly reduced.

An object of the invention is, in addition, the preparation of such a detector.

SUMMARY OF THE INVENTION

To achieve the object, according to the process an Si(Li) component is prepared which has a $p^+$ layer as well as an n layer. In doing so, layers fabricated in accordance with the state of the art can be used. According to the method, the n layer is subjected for example by chemical etching, by fine grinding or by lapping to partial removal. Lapping has been found to be especially effective. By this, the zones are reduced in which a detector of the type described at the outset was ineffective. The detector is fabricated from the so treated component. By comparison with detectors fabricated by the state of the art up to now, the dead zone is reduced.

The n layer in the component is formed by incorporating foreign ions therein, that is ions which are not silicon. As the foreign ion, especially lithium ions are provided.

The component has a thickness preferably to 2 to 10 mm. The $p^+$ layer bounds the component on one side and the n layer bounds the component on the other side. Instead of a $p^+$ layer, a $p^-$ layer or p layer can also be provided. Instead of the n layer, an $^-$ layer or n+ layer can be provided. Preferably however in the finished detector, a $p^+$ layer is provided on one side and an n layer on the opposite side.

In a refinement of the invention, the layer resistance at the surface of the n layer is measured during the removal of material therefrom. The removal of material is halted when the measured sheet resistance reaches a predetermined value which advantageously lies between 1,000 Ω/□ and 20,000 Ω/□. Especially a value of 100,000 Ω/□ should not be exceeded. The sheet resistance is a measure of the Li concentration in silicon. In the manner described the removal of material can be halted as soon as a concentration region is reached below which the concentration should not pass. This avoids complete removal of the n layer by the removal step.

In a further refinement of the invention, the n layer is fabricated by defusing lithium into the layer of interest. The lithium diffuses thus through the surface which is to be ground away in accordance with the invention so that the dead zone is reduced. In this fashion a decrease in the lithium concentration with increasing depth is ensured after the diffusion terminates and thus the lithium concentration decreases from the aforementioned surface into the layer. If material removal is carried out and during such removal the respective lithium concentration is measured and the material removal is terminated when a predetermined concentration value is reached, the dead zone having a thickness ranging from 0.5 to 5 μm can be reduced by example to 1 μm. The smaller the dead zone the less that the aforedescribed drawbacks apply. A dead zone of 1 μm has in practice not been found to be detrimental.

The removal of material in one embodiment of the invention is terminated when the lithium concentration in the silicon is between $10^{15}/cm^3$ to $10^{11}/cm^3$. In this manner there is a sufficiently large lithium supply available for functioning of the detector reliably for several years. If the material removal is carried out until the lithium concentration reaches $10^{11}/cm^3$, the detector which is finally obtained is indeed of high functionality. However, within a relatively shorter time, the concentration can sink to the point that the detector will no longer function.

If lithium is incorporated in the silicon by diffusion to produce the n layer and the material removal is halted when an electrical layer resistance of 5,000 Ω/□ is reached, this corresponds as a rule to a lithium concentration of $10^{12}$ lithium ions per $cm^2$ of the layer. The lithium concentration at the surface then amounts to typically $10^{14}$ $cm^{-3}$.

In order to create an especially suitable pattern of the lithium concentration, the diffusion of the lithium is carried out at temperatures of 200 to 250° C. After the material removal according to the method, advantageously a concentration gradient dN/dx of the lithium ions in silicon is obtained which is by one or two orders of magnitude smaller by comparison with the state of the art as is known for example from the publication IEEE Trans. NS-31, No. 1 (1984) 331. The thickness growth of the contact is thereby sufficiently reduced.

The object of the invention is thus obtained especially well with a thin n layer (contact) produced by Li diffusion. The effective thickness amounts to less than 1 μm silicon the following steps are important for production of the best embodiment:

1. Li diffusion at relatively low temperatures of about 200 to 250° C.
2. Removal of the surface layer which, depending upon the pattern of the Li concentration in the Li diffused layer, so that typically 20 to 50 μm is removed.

In a further embodiment of the invention an aluminum layer is vapor deposited to permit bonding to the Li diffusion contact.

The total number of lithium ions in the contact is always sufficient to enable the detector to be driven for at least a year at the working voltage at room temperature or to enable an after drifting following radiation damage.

A small effective thickness of the contact is in combination with a relatively small Li concentration in the contact.

For that reason the electric field can penetrate partly into the contact. The electron-hole pairs which are generated in the contact by passage of a charged particle or stopping of a photon have greater diffusion path lengths because of the low Li concentration which means that a part thereof will be collected after having reached the high field region during the signal processing duration. This process can be improved by an internal field which has its origin in the concentration gradient. This clears up the small effective thickness of the contact.

A further advantage of the thin Li diffused contact lies in the possibility of so structuring it that the transmission detector can have on both sides digitally position sensitive transmission detectors of lithium compensated silicon.

EXAMPLE

Initially an Si(Li) detector is fabricated by the generally known process (normally Li diffusion in p-type silicon, compensation by Li drifting up to the $p^+$ contact, which is produced by boron implantation or gold vapor deposition is used). The then Li diffused contact is completely removed.

A new Li diffusion is carried out. For that, $LiAlH_4$ powder is dissolved in ether. Upon the silicon substrate, which to one side has already been provided with a $p^+$ contact, the powder suspended in the solvent is applied on the opposite side. A glass plate is then placed on this side and the assembly is placed in a diffusion furnace. In the furnace an inert gas atmosphere is provided. The argon or nitrogen are suitable cases for the production of the inert gas atmosphere. The temperature in the furnace is slowly heated up in the treatment carried out at a temperature between 200 and 250° C. The temperature is maintained for 30 minutes. The dissolved or suspended powder decomposes and the hydrogen is liberated. Lithium diffuses into the silicon substrate. The assembly is then removed from the furnace and the glass plate is taken of. Initially the remaining aluminum-lithium mixture is removed by lapping. Under lapping here it is to be understood that grinding is carried out by means of a powder material.

By lapping material is removed further until the layer resistance at the surface amounts to 5000 Ω/□. The lithium concentration gradient is then typically between $10^{15}$ cm−3/10 μ to $10^{15}$ cm−3/20μm (average value).

The surface is finally chemically polished and provided with a vapor-deposited aluminum layer.

BRIEF DESCRIPTION OF THE DRAWING

The sole FIGURE of the drawing is a perspective view, partly broken away.

SPECIFIC DESCRIPTION

The n contact 1 illustrated in the FIGURE as so produced is provided with a guard ring 1a as delimited by plasma-etched groove 3 (about 50 μm wide and 30 μm deep) over which the detrimental current component of the detector originating in the outer surfaces of the compensated silicon 6 flow. The sensitive volume of the detector is determined by the inner—contact 1b, the Li compensated silicon 5 and the $p^+$ contact 2 which is also separated by a groove 4 into the inner contact 2b and a guard ring 2a.

The determination of the sheet resistance is effected by the so-called 4-point method. Four metallic point are pressed against the surface concerned and the resistance which is sought is obtained from them.

The invention claimed is:

1. A method of making a detector for the determination of the energy of photons or charged particles, the method comprising the steps of:

diffusing lithium into silicon at a temperature between 200 and 250° C. and in an inert-gas atmosphere to produce a component comprised substantially of silicon and having an n layer, an n⁻ layer or an n⁺ layer;

removing by chemical etching or by lapping a thickness of about 20 to 50 µm of the n layer, n⁻ layer or n⁺ layer of the component until a dead zone is produced having a thickness of 0.5 to 5 µm such that the dead zone does not emit an electron-hole pair when a charged particle passes or a photon is stopped while measuring a layer resistance at the surface of the n layer, the n⁻ layer, and or the n⁺ layer, wherein the n layer, n⁻ layer or n⁺ layer is removed to the extent that a concentration of lithium ions by means of which n layer, n⁻ layer or n⁺ layer are formed in the silicon substrate reaches between $10^{15}/cm^3$ and $10^{11}/cm^3$;

stopping the removal by etching or lapping when the measured layer resistance has a value between 1000 and 20,000 $\Omega/cm^2$; and processing the component so that the detector results.

2. The method according to claim 1 wherein the component is 2 to 20 mm thick and/or is bounded by a p⁺ layer on one side and the n⁻ layer on the other side and/or is lithium compensated.

3. The detector according to claim 1 wherein the n⁻ layer has a mean concentration gradient of introduced foreign ions between $10^{15}$ cm⁻³/10 µm and $10^{15}$ cm⁻³/20 µm.

4. The detector according to claim 1 wherein an aluminum layer is provided on the n layer, n⁻ layer or n⁺ layer.

* * * * *

UNITED STATES PATENT AND TRADEMARK OFFICE
CERTIFICATE OF CORRECTION

PATENT NO. : 7,338,829 B2 Page 1 of 1
APPLICATION NO. : 10/494412
DATED : March 4, 2008
INVENTOR(S) : Davor Protic et al.

It is certified that error appears in the above-identified patent and that said Letters Patent is hereby corrected as shown below:

Title page, item [54] and col. 1 should read as follows:
-- TRANSMISSION DETECTOR AND CORRESPONDING PRODUCTION METHOD --

Signed and Sealed this

Twenty-third Day of February, 2010

David J. Kappos
*Director of the United States Patent and Trademark Office*